United States Patent [19]

Jung et al.

[11] Patent Number: 4,561,016

[45] Date of Patent: Dec. 24, 1985

[54] METHOD AND APPARATUS FOR RECORDING COLOR PICTURES FOR MULTICOLOR PRINTING

[75] Inventors: Eggert Jung, Schönberg; Christian Roes, Kiel; Andreas Wigger, Kiel; Ernst-August Ziemen, Kiel, all of Fed. Rep. of Germany

[73] Assignee: Dr. -Ing. Rudolf Hell GmbH, Fed. Rep. of Germany

[21] Appl. No.: 495,581

[22] Filed: May 18, 1983

[30] Foreign Application Priority Data

Jun. 4, 1982 [EP] European Pat. Off. ........ 82104918.6

[51] Int. Cl.$^4$ ............................................. H04N 1/46
[52] U.S. Cl. ........................................ 358/76; 358/80
[58] Field of Search ............................... 358/75, 76, 80

[56] References Cited

U.S. PATENT DOCUMENTS 4,393,399 7/1983 Gast ...................................... 358/80

FOREIGN PATENT DOCUMENTS 1534427 12/1978 United Kingdom .
2067043 7/1981 United Kingdom .

OTHER PUBLICATIONS

Laser Plus Elektronik-Optik No. 2/1973.
International Patent Application PCT/AU 80/00006 (WO80/02467).

Primary Examiner—Michael A. Masinick
Attorney, Agent, or Firm—Hill, Van Santen, Steadman & Simpson

[57] ABSTRACT

Method and apparatus for recording color pictures wherein color proofs are made before the actual printing for quality control in multicolor printing processes. The color pictures are exposed on a chromatic material wherein the exposed colors must coincide with the colors which are later to be printed on paper. So as to achieve the color equivalent color picture exposure, the required color density values for the chromatic material of the selected printed and exposed colors are identified with a visual or mensurational comparison of the CIE coordinates. The identified color density values for the exposed colors are allocated to the corresponding color separation values of the colors to be printed and during recording the allocated color density values are utilized instead of the color separation values and are converted into signals for driving a color exposure unit for example a proof recorder.

23 Claims, 15 Drawing Figures

METHOD AND APPARATUS FOR RECORDING COLOR PICTURES FOR MULTICOLOR PRINTING

BACKGROUND OF THE INVENTION

1. Field of the Invention

The invention relates in general to electronic reproduction technology for multicolor printing processes and apparatus and particularly to the production of color pictures and proofs for quality control before actual printing occurs.

2. Description of the Prior Art

In electronic reproduction of color masters three primary measured color value signals are obtained in a color scanner by means of point-to-point and line-by-line trichromatic master scanning and opto-electronic conversion of the scanning light with the three primary measured color value signals being a measure of the color components of red, green and blue of the scanned image points. A color correction computer corrects the measured color value signals and in the case of four color printing generates four color separation signals for preparation of color separations of "yellow", "magenta", "cyan" and "black". The color separation signals determine the amounts of yellow, magenta, cyan and black which will be printed with the printing ink during printing.

The printing forms for printing are then produced from the color corrected color separation signals.

Printing occurs by superimposed printing of the printing forms which are inked with the four different color printing inks on a single sheet of paper with a printing machine for the associated printing method.

So as to monitor the anticipated printing results, particularly the color before the actual circulation run or press run occurs and also if desired to make further corrections of the printing forms, proofs are produced from the printing forms with special proofing machines before the press run occurs. Such proofs thus can only be produced when the printing forms already exist.

Color checking methods in which the color controlled images can be produced in a photographic manner allow monitoring possibilities for the final production in the reproduction process which is to later occur and before the manufacture of the printing form. Also, the color separations make it possible for one skilled in the art to draw conclusions concerning the color impressions of the final product and of correspondingly correcting the color separations. These possibilities of supervising and adjusting the colors however are eliminated in modern reproduction equipment and systems, since the production of the color separations on film material eliminated as an intermediate step prior to the printing form and a purely data-wise processing of a master up to the printing form occurs instead.

Monitors which are color display devices wherein the results of the multicolor print is simulated on a color monitor can also be employed for color monitoring before the production of the printing forms. Printing simulation computers are available for print simulation in which the color separation signals are converted into drive signals for the color monitor and which consider the printing parameters and the properties of the color monitor such that the screen picture gives the same chromatic impression as does the anticipated multicolor print on the single edition paper. Print simulation on a color monitor has the disadvantage that only a transient image occurs which is when the image is projected on the monitor.

In the printing industry, however, it is desired to have a physical colored control images so-called proofs available which can be sent to the customer for evaluation for his authorization of the printing order.

For these proofs to provide a reliable color indication concerning the reproduction quality of the multicolor print which is to be later produced they must coincide colorimetrically with the highest possible degree with the actual multicolor print which is to be produced.

A recording device has been disclosed in International Patent Application No. PCT/AU 80/00006 (WO 80/02467) wherein color films are exposed by chromatic laser light which is modulated by stored image data. This known recording device, however, is not suitable for producing proofs in multicolor printing because this apparatus does not specify how the color separation signals must be converted into corresponding modulation signals for the laser light so that the multicolor print and proof are isochromatic.

This invention concerns the production of monochrome or color images on photographic film from data provided by digital computer. Although such data may take any form, the present invention is particularly suited to producing detail color composite images of land terrain from digital spectral data provided by LANDSAT and NOAA satellites.

The principle object of the present invention is to provide a laser-base system for producing images on film using data from a computer which will overcome or avoid the inherent problems of stability and/or alignment of the light beam or beams. With such a system, the advantages of the high-intensity laser output can be realized in more rapid scanning of the beam over the film, or improved picture quality, or both. In regard to multicolor image systems, the present invention provides an arrangement which will allow beams from different lasers to be combined together and brought to a focus simultaneously at one spot on the film (or other image producing medium) so that further advantages of speed are realized without sacrificing fidelity.

This invention concerns the production of monochrome or colour images on photographic film from data provided by a digital computer. Although such images may take any form, the present invention is particularly suited to producing detailed colour composite images of land terrain from digital spectral data provided by LANDSAT and NOAA satellites.

Referring now to FIG. 6, the apparatus illustrated is a three-colour system employing three lasers as light sources. The laser 110 is a helium-cadmium laser having an output of 10 milliwatts at a wavelength of 0.442 micrometers. Laser 111 is a 50 milliwatt argon ion laser having an output wavelength of 0.5145 micrometers. Laser 112 is a helium neon laser having an output of 5 milliwatts at a wavelength of 0.6328 micrometers. High quality lasers with good long term output stability and minimal high frequency (MHz) fluctuations are most desirable for the system. Typical lasers are those provided by Spectra-physics International, Model No. 120 (helium/neon) and Model No. 122-03/262 (argon), and the Linconix laser Model No. 4110 (helium cadmium).

As shown in FIG. 6, a portion of the output of each laser is sampled by the use of a respective pellilcle beam splitter 113, 114 or 115. The sampled portions of the laser beams are directed on to the respective photodiodes 116, 117 and 118, the outputs of which are compared with reference voltages 133, 134, 135 established during the initial calibration of the equipment. The differences between the photo-diode outputs and the reference voltages are amplified and input to the power supplies 136, 137, 138 of the electro-optical modulators 119, 120, and 121.

The main portions of the laser beams are passed through respective electro-optical modulators 119, 120 and 121. Each of these modulators is controlled by a drive circuit 126, which is in turn controlled by an interface network which is fed with digital electronic information from an electronic computer (not shown). The three analogue voltage outputs from drive circuit 126 are connected to the power supplies 136, 137 and 138 of the electro-optical modulators 119, 120 and 121. These signals are the major controlling signals of the modulators. The analogue voltages from the photo diode/reference voltage combinations exercise a "fine-tuning" control of the transmittance of their respective modulators.

The modulated red beam which emerges from modulator 121 is directed via a front surface mirror 122 through a red transmitting dichroic filter 123, and is then reflected from a blue transmitting dichroic filter 124.

The modulated green beam which emerges from modulator 120 is reflected from the red transmitting dichroic filter 123. The laser 111 and its associated modulator 120 are positioned so that on reflection from filter 123, the green beam is aligned to combine with the red beam from mirror 122. The green component of this combined beam is also reflected from the blue transmitting dichroic filter 124.

The modulated blue beam which emerges from modulator 119 is transmitted through the blue transmitting filter 124. Laser 110 and its associated modulator 119 are positioned so that the blue beam is aligned to combine with the red/green beam which has been reflected by filter 124 to produce a combined red/green/blue beam.

This combined red/green/blue beam is then passed through an electro-optical modulator 125 which is adapted to provide chopping of the combined red/green/blue beams. The chopping action of modulator 25 is controlled by its associated power supply 132, which receives signals from the drive circuit 124 to synchronise with the timing requirements of the film recording device.

A color picture recorder with laser exposure for recording video transmissions is disclosed in the periodical Laser+Elektronik-Optik, No. 2/1973. This device cannot be employed in multicolor printing since NTSC color television signals are converted there into modulation signals for the laser light.

SUMMARY OF THE INVENTION

It is an object of the present invention to provide a method and apparatus for recording color pictures in multicolor printing so that the greatest possible chromatic coincidence between the color picture and the final multicolor print is achieved so that a high-grade and reliable indication of the anticipated reproduction quality is possible.

A feature of the invention is to provide supplying digital color separation signals to a proof recorder which produces on photographic materials a proof which accurately indicates what the final printing will look like and wherein adjustments may be made before the final printing.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
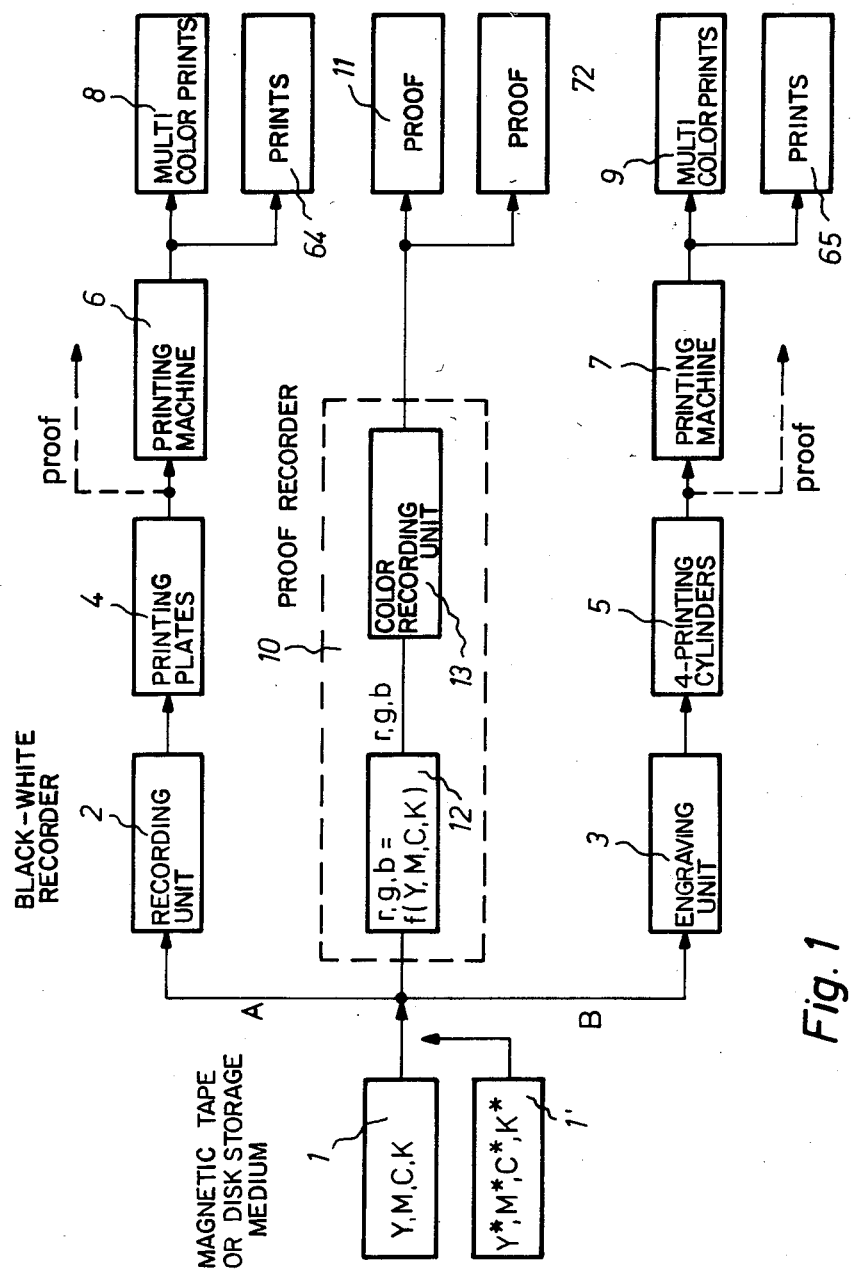
FIG. 1 is a block diagram illustrating the invention.

FIG. 1 comprises a block diagram showing a schematic reproduction sequence from the stored color separation values through the finished multicolor print for offset printing and/or rotogravure methods.

Digital color separation values Y, M, C and K of the color separations "yellow" (Y), "magenta" (M), "cyan" (C) and "black" (K) of an image to be printed are stored image-point-wise in a storage medium 1 which may be a magnetic disk or tape. The color separation values indicate the amounts of printing ink required or, respectively, the size of the cup volumes in rotogravure printing or the sizes of the raster points in offset printing.

The digital color separation values deposited in the storage medium 1 can be both color separation values of a single image or an assembled printing page. The color separation values of the single images are obtained in a color scanner by means of point-wise trichromatic scanning opto-electronic conversion of the scanning light into measured color value signals and production of the color separation signals by using a color correction from the measured color value signals by considering the regularities of subtractive color mixing as well as by means of analog to digital conversion of the color separation signals.

The combination of the color separation values of the individual image to form the data set of a printing page according to a layout plan occurred for example in an image processing system by using an electronic page montage such as described in German OS No. 21 61 038 (GB-PS 1407487) which is hereby incorporated by reference. If required, the color separation values may be additionally modified in the image processing system with a topically limited electronic retouch according to that described in German OS No. 29 20 058 so as to optimize the color correction or in order to make editorial changes which the client desires.

For producing the printing form, the color corrected and/or retouched and combined color separation values are read from the storage medium 1 and for offset printing which is indicated by a path A, these signals are supplied to a black/white recording unit 2. In the case where rotogravure is to be used (path B), the corrected color separation values are supplied from the storage medium 1 to an engraving unit 3 and are there reconverted into analog color separation signals.

Figure 7:
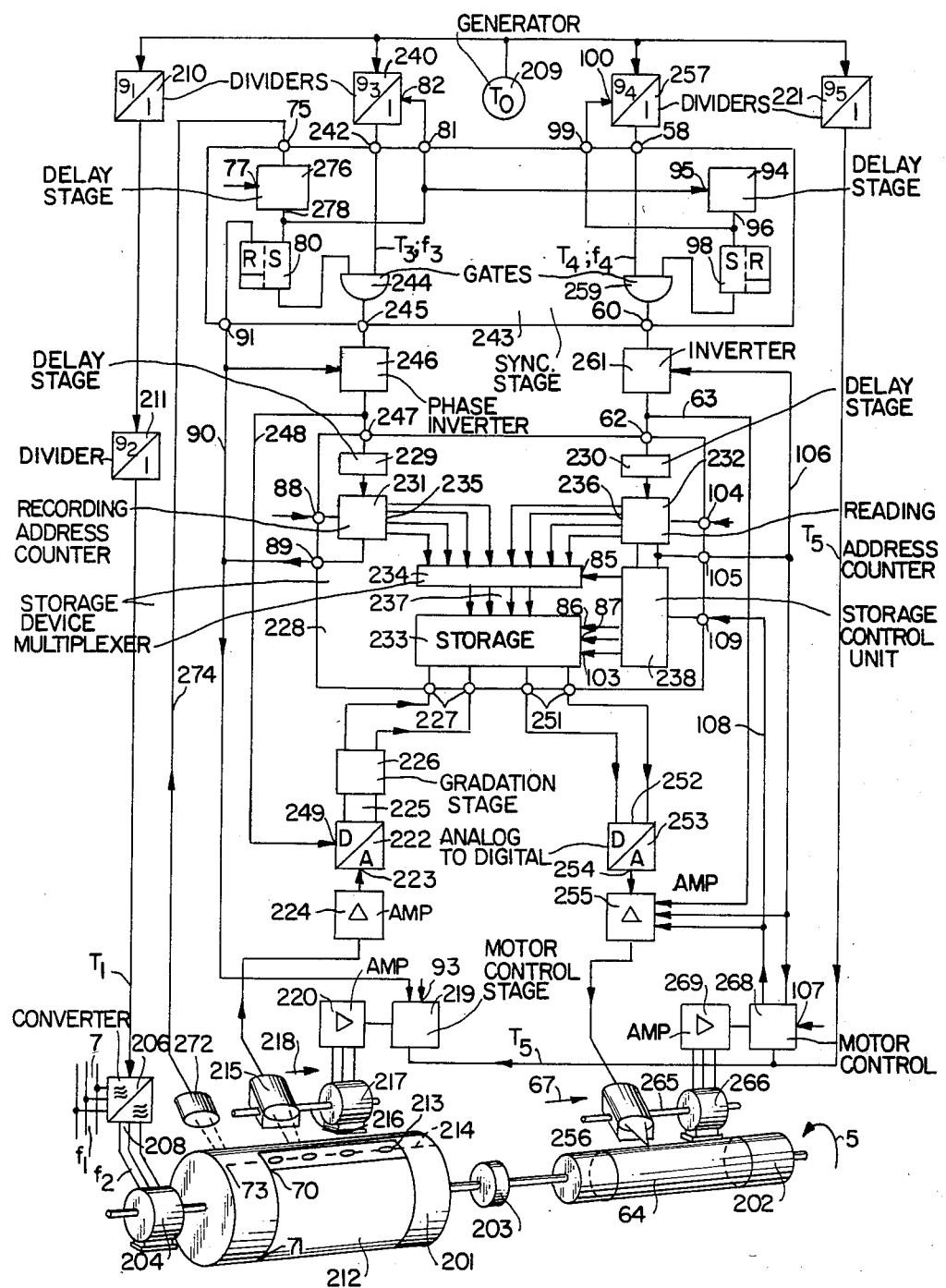
FIG. 7 illustrates the color scanner 3 and recorder 4.

FIG. 7 is a block diagram for an embodiment of the instant invention. An image cylinder 201 and an engraving cylinder 202 are directly coupled to each other through a coupling 203. The image cylinder 101 has a uniform circumference and can be an integral component of the engraving set-up, whereas engraving cylinders of different diameters can be used in the system. Generally, the diameter of the largest engraving cylinder to be used is preferably slightly smaller than the diameter of the scanning cylinder 201.

In a preferred embodiment, the circumference of the engraving cylinder 202 is about ⅓ of the circumference of the image cylinder 101.

In carrying out the process, the entire surface of the engraving cylinder 202 is engraved. Under this assumption, the image pattern 212 at a reproduction scale 1:1 and for the preferred diameter ratio, covers only a third of the circumference of the image cylinder 201.

Of course, the engraving can be carried out with another scale and with incomplete engraving coverage.

The image cylinder 201 and the engraving cylinder 202 are driven by a synchronous motor 204 in the direction of arrow 5. The synchronous motor 204 is energized from a power supply having a frequency $f_1$ through a converter 206. The converter 206 generates from the power supply lines 208 which carry a signal having a frequency of $f_2$ which depends upon the frequency of a timing signal $T_1$ which is connected to the converter 206. The rate of rotation of the synchronous motor 204 is proportional to the frequency $f_2$ and is also proportional to the frequency of the timing signal $T_1$.

The timing signal $T_1$ is obtained from the frequency division of a timing signal $T_0$ which is generated by generator 209. The frequency division is carried by a first dividing stage 210 having a dividing factor of $q_1$ which is adjustable and another dividing stage 211 having a constant dividing factor $q_2$.

The adjustment of the dividing factor $q_1$ of the dividing stage 210 changes the frequency of the timing signal $T_1$ and, in turn, the rate of revolution of the synchronous motor 204. This provides a control for the rate of revolution of the image cylinder 201 and engraving cylinder 202.

The image pattern 212 is connected to the surface of the image cylinder 201 by use of a row of alignment pins 213 which are disposed along a surface line 214 and are accurately positioned.

The image pattern 212 is optically scanned image line by image line by means of a scanning member 215 to generate an image signal. The scanning member 215 can be moved parallel to the axis of the image cylinder 201 in the direction of the arrow 218 by the use of a spindle 216 and a stepping motor 217.

The stepping motor 217 receives a timing signal $T_5$ through a motor control stage 219 and a power amplifier 220. The timing signal $T_5$ is generated through the division of the timing signal $T_0$ in a dividing stage 221 having a dividing factor $q_5$.

The gravure and the image pattern 212 cover different portions of the circumferences of the respective image cylinder 201 and engraving cylinder 202 so it is necessary to store the image signal before it energizes engraving member 256. This is carried out by the use of an intermediary storage device.

For the system shown in FIG. 7, the image signals are in analog form and must be converted to digital signals. The scanning member 215 is coupled to an amplifier 224 which is connected by line 223 to an analog to digital converter 222. The digital signal from converter 222 is connected by lines 225 to a gradation stage 226 which assigns tone values. The gradation stage 26 is coupled to the input terminals 227 of storage device 228.

The storage device 228 includes a delay stage 229, another delay stage 230, a recording-address counter 231, a reading-address counter 232, a storage unit 233, a multiplexer 234 for selectively connecting the lines 235 of the recording-address counter 231 or the output lines 236 of the reading-address counter 232 through the address input lines 237 of the storage unit 233 and a storage control unit 238 for the control of the read-in and read-out processes.

A scanning timing signal $T_3$ having a frequency of $f_3$ is used to control the converter 222 and the recording-address counter 231. The timing signal $T_3$ is obtained by the frequency division of the timing signal $T_0$ in a dividing stage 240 having a dividing factor of $q_3$ which is adjustable. The timing signal $T_3$ is coupled to AND gate 244 through the line 242 of a synchronization stage 243 and through the output terminal 245 of the AND gate 244 it is connected to a phase inverter 246. The output terminal 245 is common to the synchronization stage 243. The phase inverter 246 supplies the timing signal $T_3$ to the input terminal 247 of the storage device 228 in order to control the selection of the recording addresses and through line 248 to the input terminal 249 of the converter 222 in order to control the analog to digital conversion.

A data output terminal 251 of the storage device 228 is connected to the digital input terminal 252 of a digital to analog converter 253. This forms a part of the read-out circuit for the image signals being stored. The analog output terminal 254 of the converter 253 is connected to the engraving member 256 through an engraving amplifier 255. Although the engraving member is shown here as a mechanical device, an engraving member in the form of an electron beam or laser beam could be controlled by the image signals. In the case of one of these beams, cavities would be formed by the radiation of the surface of the engraving cylinder.

Furthermore, a timing signal $T_4$ having a frequency of $f_4$ is used to control the read-out of the image signals from the storage device 228 and for the resolution of the image pattern 212 during the engraving. The timing signal $T_4$ is generated by dividing the timing signal $T_0$ in a dividing stage 257 having a constant divided factor of $q_4$. The timing signal $T_4$ is connected to the input terminal of the synchronization stage 243 and is connected from there to the AND gate 259 to the output terminal 260 which is connected to the inverter 261. The timing signal $T_4$ passes through the phase converter 261 and is connected to the input terminal 262 of the storage unit 228 for the purpose of selecting the read-out addresses in order to resolve the image pattern 212 and is also connected by line 263 to the ampliier 255.

The amplifier 255 converts the timing signal $T_4$ into a sinusoidal signal which is superimposed onto the image signals. The engraving member 56 uses an engraving needle as a cutting tool to execute the gravure on the engraving cylinder 202. The engraving member 256 moves parallel to the axis of the engraving cylinder 202 in the direction of the arrow 267 by the action of the forward thrusting device comprising a spindle 265 and a stepping motor 266. The stepping motor 266 is controlled by the timing signal $T_5$ which is connected to a motor control stage 268 and a power amplifier 269.

The scanning member 215 is not moved during the scanning of a cylindrical peripheral image line and likewise, the engraving member 256 remains at rest during the recording of the image signals for an image line. The cylindrical peripheral image and engraving lines are concentric in the preferred embodiment.

The distance "d" between two cavities on an engraving line is determined by the screen width to be engraved. In the case of complete coverage, a number "$Z_n$" of cavities for an engraving line can be computed from the circumference "$U_d$" of the engraving cylinder 202 and the distance "d". "$Z_n$" can be an integral number or a fraction. If a gapless screen is desired, then an integral number "$Z_n$" of cavities must be engraved on an engraving line.

To achieve this, the frequency $f_4$ of the timing signal $T_4$ or the rate of revolution of the engraving cylinder 202 is changed slightly in order to make the number "$Z_n$" become an integral number.

This is achieved by adjusting the dividing factor $q_1$ of the dividing stage 10.

The width of the screen to be engraved also determines forward thrusting width for the scanning member 215 and the engraving member 256 in correspondence to the step of the stepping motors 217 and 266. The depth of the cavity to be engraved is determined by the tone value of the image points on the image pattern 212. The number "$Z_n$" of the image points scanned from the beginning to the end of an image line is equal to the number "$Z_n$" of the cavities engraved on an engraving line and the distance between two image points corresponds to the distance between corresponding cavities. These conditions are attained through the adjustment of the frequency $f_3$ of the timing signal $T_3$ so that the ratio of the frequencies for the timing signals $T_3$ and $T_4$ is substantially the same as the ratio of the diameters of the image cylinder 201 and the engraving cylinder 202.

For example, the frequency $f_3$ is substantially three times as great as the constant frequency $f_4$.

The frequency $f_3$ is adjusted to the appropriate selection of the dividing factor $q_3$ of the dividing stage 240.

During the process, the first image point of an image line is scanned at the upper margin 270 of the image pattern 212 and the last image point is at the lower margin 271. The rate of revolution "n" of the image cylinder 1 and the frequency $f_3$ are selected so that exactly "$Z_A$" image points are scanned on an image line from the upper margin 270 to the lower margin 271.

For each cycle of the timing signal $T_3$, the particular image point on the optical axis of the scanning member 215 is scanned. For this reason, the rotation of the image cylinder 1 and the timing signal $T_3$ have to be synchronized so that the first cycle of the timing signal $T_3$ occurs when the first image point is on the optical axis.

To achieve this, the synchronization stage 243 and a sensor 272 are provided. The sensor 272 optically scan for the reference mark 273 and generates a reference pulse signal once for each revolution. The reference mark 273 is disposed on the surface line defined by the alignment pins 213.

The optical axes of the sensor 272 and the scanning member 215 are substantially on the same surface line or element and the reference pulse signal is generated when the alignment pins 213 are below the scanning member 215. The sensor 272 is connected by line 274 to the input terminal of the synchronization stage 243 and a delay stage 276. The delay stage 276 can be a monostable one-shot stage. The time delay is adjusted by an input to the control terminal 277.

The time delay is adjusted so that the delay pulse signal apears at the output terminal 278 of the delay stage 276 at the substantially exact time the first image point is along the optical axis of the scanning member 215.

Figure 8:
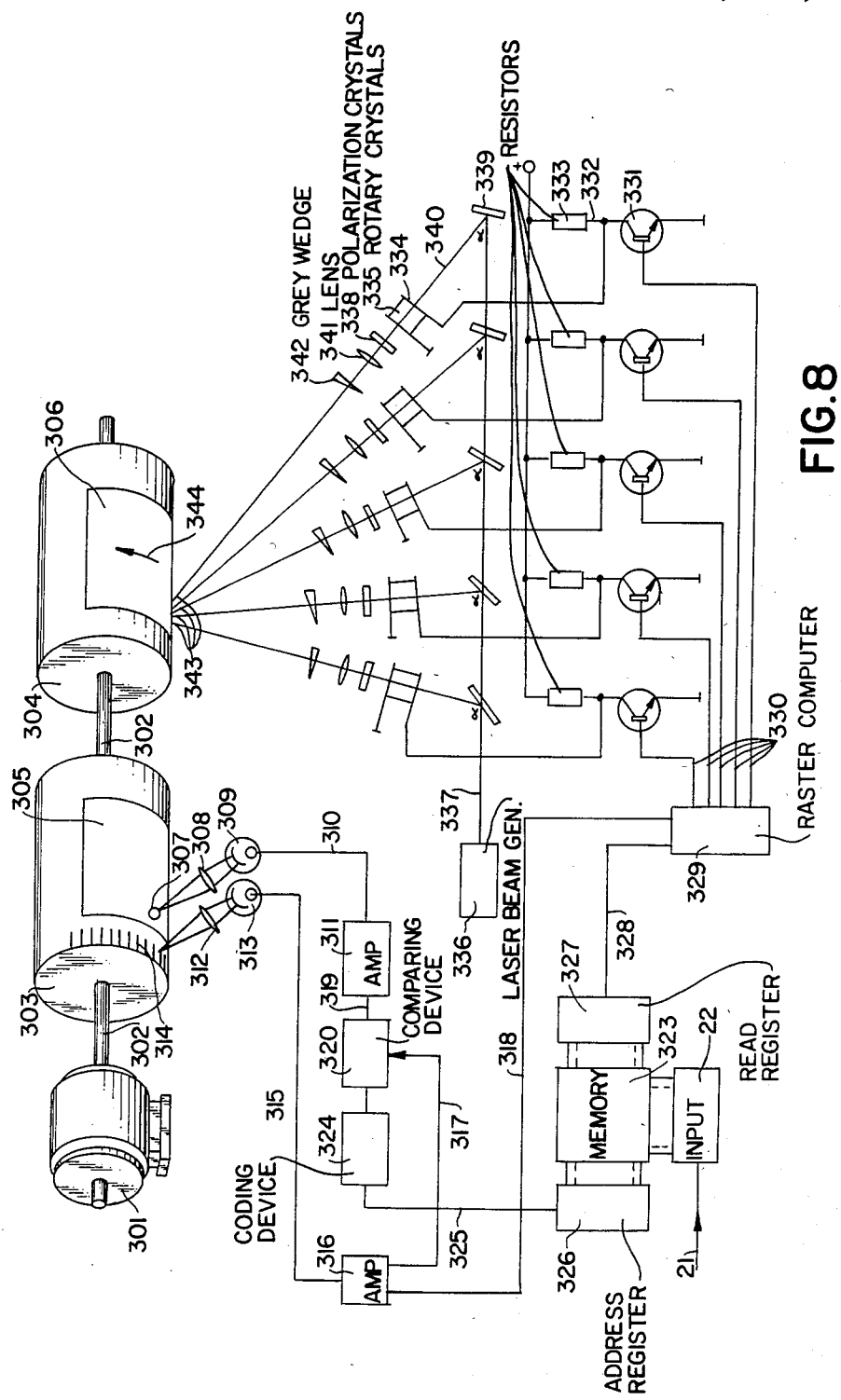
FIG. 8 illustrates the black-white recorder block 2.

FIG. 8 shows a coding device 324 which is operable to supply a binary number for the corresponding density state or value derived in the comparing device 320 and represents the address of which the recordation date of the associated register spot in the memory 323 can be obtained. This number of conducted over the conductor path 325 to an address register 326 as a combination of binary voltage values with the conductor path 325, comprising, for example, six individual conductors when the number of distinct covering spots is 64. Thus, the addresses at which the recordation date pertaining to the covering spots are thereby stored. Controlled by suitable memory-associated automatic electronic means, the read-out of the data into a read register 327 will begin immediately and conducted over conductor path 328 to a raster computer 329 which is also controlled by timing pulses conducted over the timing pulse conductor 318, which pulses have the same frequency as pulses at the line 317 but are delayed for a brief period of time with respect thereto, whereby the operational time of the coding device 324 and cyclic time of the memory 323 are compensated.

The raster computer 329 has as many outputs 330 as the number of adjacently arranged light dots employed for the recordation. In the illustrated example only 305 are depicted, but in actual practice up to 310 may be employed. The outputs 330 are connected with suitable amplifiers 331, which for example, may be transistors whose emitters are disposed at zero potential and the collectors connected with the positive pole of a voltage source, over resistors 333. The collectors 332, forming the output of the amplifiers, are connected with the control electrodes 334 of respective so-called rotary crystals 335. Such crystals possess the property that the polarization planes of polarized light passing therethrough are rotated under the effect of an electric field.

The reference numeral 336 generally designates a laser beam generator producing a constant polarized light beam 337 which passes through five partially reflective partially light-permeable mirrors 339 whereby respective secondary beams 340 are reflected out of the main laser beam 337 and directed onto the recordation area 343 of the film 306 by suitable adjustment of the respective mirrors 339. The individual secondary beams must be very carefully and exactly directed so that they project a group of closely adjacent light dots which are equal in width to the raster field. The reflective surfaces, for example, evaporated on, are so constructed that the individual beams 300 have approximately equal light intensity irrespective to the different reflection angles. Exact equalization between the respective beams may be achieved by the adjustment of suitable gray wedges 342, operative to vary the light intensity in dependence upon the length of light travel therethrough.

Disposed in the path of each light beam 340 between the recordation area 343 and the respective mirrors 339 are respective corresponding rotary crystals 335, polarization filters 338 and lenses 341. Thus, each light beam reflected from an associated mirror 339 will initially pass through the cooperable rotary crystal 335, polarization filter 338, lens 341 and gray wedge 342. The polarization planes of the filters 338 are rotated exactly 90° with respect to the polarization planes of the respective beams whereby no light will pass to the recording medium 306 as long as the crystals 335 are not excited. However, if voltage is applied to the control electrode 334 of a rotary crystal 335 over associated conductor 330 and amplifier 331, and electric field will be produced in the crystal, since the opposing electrode has zero potential, resulting in a rotation of the polarization plane of the associated laser beam 340. As the polarized light now will not strike the filter at the blocking angle at least a part of the light will pass therethrough, such light portion corresponding to a non-linear function depending on the angle of rotation between the two polarization planes. In this instance, scanning is intended to be effected only between "dark" or "closed" and "light" or "open" conditions so that the crystals 335 may be considered to be utilized as light switches.

It will be appreciated that instead of dividing the respective secondary beams 340 from a main laser beam, as illustrated in FIG. 8, each individual beam 340 could be derived from an individual laser beam generator, but it will be appreciated that the duplication involved would entail a prohibitive cost and thus would be commercially impractical.

The recordation drum 304 rotates in a direction indicated by arrow 344 and the respective light paths which are projected onto the recordation medium or film 306 at the aea 343 by the fixedly positioned beams 340 will during the bright scanning, record adjacent lines. As a result of the bright/dark scanning, utilizing the crystals 335, raster spots are recorded therefrom which appear in the example as squares standing on one corner i.e., diagonally extending and presenting a diamond appearance. It will be appreciated that to enable a better understanding, the size thereof has been exaggerated. In reality they will be so small that they cannot be recognized by the human eye with dimensions in practice being about 0.25 mm for the raster field and with a number, for example, of 310 individual beams, 0.025 mm for the diameter for the respective light dots.

When four-color printing is to occur, four raster color separation are produced by the recording unit 2 on film material from which the printing plates 4 are then manufactured or upon which they are directly exposed on the printing plates 4. The engraving unit 3 produces and engraves four printing cylinders 5 in path B.

A "Chromagraph DC 300" from Dr. Ing. Rudolf Hell GmbH can, for example, be employed as the recording unit 2. A "Klischograph K 200" available from Dr. Ing. Rudolf Hell GmbH can be employed as the engraving unit 3. The functioning of these devices are known and are also described respectively in German Letters Patent No. 21 07 738 and German Letters Patent No. 25 08 734.

The printing plates 4 are mounted on the printing machine 6 and printing occurs with printing inks yellow, magenta, cyan and black to produce the multicolor print 8 by offset printing. In the rotogravure system, multicolor prints 9 are produced with the printing machine 7.

So as to make a check of the quality and color of the anticipated printing results before the printing of the final prints 8 and 9 are printed, a proof 11 is produced which is exposed on a color material, for example, on a color film which is produced by the proof recorder 10 which receives the stored Y, M, C and K signals from the storage medium 1 and the proof 11 is isochromatic with the multicolor prints 8 and 9 which are later to be produced and, thus, by examining the proof 11 the results of the final multicolor prints 8 and 9 can be determined.

The presently conventional techniques for film recording of color TV video signals employ a system in which the color image is filmed from a monitor with a film camera. This method leads to a considerable impairment of the image quality. Therefore, in a common development program of the CBS laboratories and the CBS television network engineering department, a new method; namely, the laser recorder, was developed.

In a block circuit diagram for the processing of the video signal, the first demand is to take from the NTSC-video signal as much information as possible in order to also actually exploit the capability of the recorder for high resolution. To this end, an image amplifier in conjunction with the comb filter is employed which is transmissive to the brightness information, but suppresses the color information. The image amplifier ensure an aperture compensation and contains steepness circuits in order to preamplify the signal. The color signals are transmitted to a NTSC-decoder whose output signals are processed with the brightness information into the video signals for red, green and blue.

These color signals reach an additional module which compensates the different threshold sensitivities of the film and the NTSC-transmission. In a dynamic equalizer it is ensured that the output video signals exhibit a gamma of one. Additional black-white-expansion circuits compensate the non-linear sensitivity characteristic of the film material.

The signal for the vertical deflection is filtered and transmitted to the drive of the film camera.

The rack for the electronics contains both a monitor for the recorded image as well as one for the signals. The portion of the modulated laser radiation strikes the photo diode. In this manner, a color monitor receives the necessary signals for rendition of the image during the recording. This control possibility is very important. It renders possible a correct exposure and color tuning of the resulting film copy.

Figure 2:
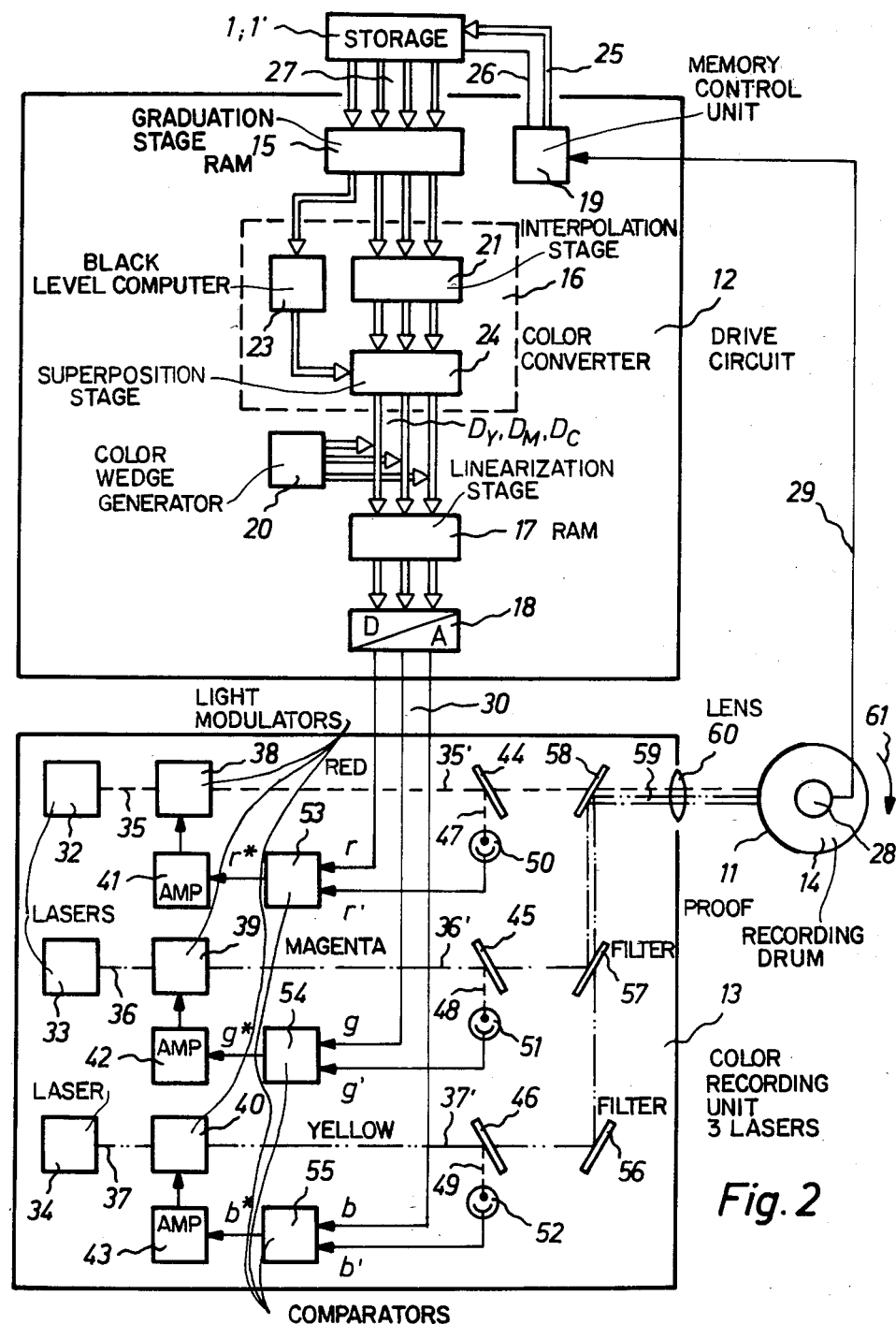
FIG. 2 is a block diagram illustrating the proof recorder.

FIG. 2 is a block diagram of the proof recorder 10 and consists of a drive circuit 12 and a color recording unit 13. In the drive circuit 12, the color separation values Y, M, C and K are converted according to the following equation 1 into drive signals r, g and b which are supplied to the color recording unit 13.

$$r, g, b = f(Y, M, C, K) \tag{1}$$

The color recording unit 13 generates a red, a green and a blue light beam which are selectively intensity modulated by the associated drive value signals r, g and b.

The three intensity modulated light beams are used to expose the color film point-by-point and line-by-line so that each light beam activates one of the three color layers of the color film. The exposed and developed color film forms the desired proof 11.

The following interrelationships apply to the conversion of the color separation values Y, M, C and K into the drive signal values r, g and b for the light beams.

Each quartet of the color separation values Y, M, C and K represent a color of the multicolor print 8 or 9 to be printed on the single edition paper which is referred to herein as the printing color.

Every color produced on the color film referred to herein as the film color is characterized by the color concentrations or, respectively, color density triads $D_Y$, $D_M$ and $D_C$ obtained in the color layers of the color film.

For the purpose of producing a proof 11 isochromatic with the multicolor print 8 or 9 therefore, the color density triad $D_Y$, $D_M$ and $D_C$ (rated color densities) which represent the film color colorimetrically coinciding with the corresponding print color must be allocated to each quartet of color separation values Y, M, C and K.

$$D_Y, D_M, D_C = f_1 (Y, M, C, K) \quad (2)$$

So as to generate the identical film colors on the color film, the rated color densities $D_Y$, $D_M$ and $D_C$ must be converted into corresponding drive values r, g and b according to equation 3.

$$r, g, b = f_2 (D_Y, D_M, D_C) \quad (3)$$

The drive value signals r, g and b determine the light energies supplied to the color layers of the color film and these in turn determine the color or dyestuff concentrations or, respectively, the color densities in the film layers and, thus, the film color in the final analysis.

Since the relationship between drive values and light energies on the one hand and between the light energies and the achieved color densities based on the color gradation of the color film on the other hand is not linear, a light regulation and color density linearization ($f_2$ = linearization function) must be accomplished so that the rated color densities $D_Y$, $D_M$ and $D_C$ are also obtained in the color film. Thus all further considerations can be based on equation 2 since each color density triad $D_Y$, $D_M$ and $D_C$ indicates that the color film values are actually obtained.

The method for identifying the color density triad $D_Y$, $D_M$ and $D_C$ associated with the respective color separation quartets Y, M, C and K according to equation 2 is the primary inventive concept of the present invention. For the purpose of executing the method according to the invention, selected color separation values Y*, M*, C* and K* are deposited in a further storage medium 1' illustrated in FIG. 1.

The operation and structure of the proof recorder 10 may be considered relative to FIG. 2 which shows a detail sample embodiment of the proof recorder 10 which has the drive circuit 12 and the color recording unit 13. A recording drum 14 carries the color film 11 (proof) which is to be exposed and the color film is mounted on the outer surface of the recording drum 14 with a suitable holding means. It is to be realized, of course, that a flat bed recording system can also be utilized.

The drive circuit 12 comprises a gradation stage 15 which receives the incoming signals from storage 1 or 1' and supplies an output to a color converter 16 which supplies an output to a linearization stage 17 which supplies an output to a digital to analog converter 18. A color wedge generator 20 also supplies an input to the linearization stage 17 and a memory control unit 19 is also connected to the storage means 1 or 1'. The color converter 16 comprises an interpolation stage 21 which receives the output of the gradation stage 15 and supplies an input to a superposition stage 24. A black level computer 23 receives an output from the gradation stage 15 and supplies an input to the superposition stage 24.

The drive circuit operates in the following manners. So as to expose the color film 11, the memory control 19 calls in the addresses of the storage medium 1 or 1' through an address bus 25 and the color separation values Y, M, C of the individual image points are read out line-by-line and with a line image-point-by-image-point to a line 26 with a read clock signal and are forwarded over data buses 27 to the drive circuit 12. Due to a pulse sequence which is generated in a pulse generator 28 coupled to the recording drum 14 which supplies an output to the memory control 19 over line 29, the read clock and, thus, the read-out operation from the storage medium 1 is synchronized with the rotational motion of the recording drum 14.

The color separation values Y, M, C and K are modified in the gradation stage 15 according to a print gradation curve depending on the printing process to be used so that they are proportional to the print density. The print gradation stage 15 may, for example, be a reloadable memory (RAM) in which the print gradation curve is stored. The modified color separation signals Y, M, C are supplied to the interpolation stage 21 and the color separation values for the black separation are supplied to the black level computer 23 in the color converter 16.

The interpolation stage 21 produces the color density triad signals $D_Y$, $D_M$ and $D_C$ according to equation 1. In the selected sample embodiment, the allocation of the color separation values and color densities according to equation 1 has in advantageous manner only been calculated for a point of reference network of the print color space and has been deposited in an internal supporting reference value memory of the interpolation stage 21 and the allocations required when recording the proof are identified by using interpolation. Alternatively, the allocation for all theoretical possible colors of the print color space can also be calculated before the proof is recorded being calculated independently of the actual data base of the storage medium 1 or, respectively, independently of the colors to be printed. In this case, the interpolation stage 21 is replaced by a corresponding larger allocation memory. The black level computer 23 calculates the black levels from the color separation values K and these are added to the color density triads by way of correction in the superposition stage 24. The calculation of the black levels can occur before the proof is recorded and can be incorporated into the data base of the supporting reference memory or, respectively, into the allocation memory.

The color density values $D_Y$, $D_M$ and $D_C$ output from the color converter 16 are linearized in the linearization stage 17 as the function of the $\gamma$ values or, respectively, of the gradation curves of the color layers of the color film employed and are converted into the digital drive signal values. In the digital-to-analog converters 18, the digital drive signal values are converted into analog drive signal values r, g and b and are supplied to the color recording unit 13 through lines 30. The linearization stage 17 may be a reloadable memory (RAM) in which the digital drive value r, g and b identified by the linearization are stored and are recovered by the corresponding density values $D_Y$, $D_M$ and $D_C$.

In the sample embodiment the color recording unit 13 consists of three lasers 32, 33 and 34 which produce monochromatic laser light in the red, green and blue spectral ranges. The laser 32, for example, is a HeNe laser having a wavelength of 633 nm (red). The lasers 33 may be an Ar laser with the wavelength of 514 nm (green) and the laser 34 may be an Ar laser with a wavelength of 476 nm (blue).

Alternatively, a multiline laser could be employed generating narrow band laser light in all three spectral ranges. The red, green and blue laser beams 35, 36 and 37 are intensity modulated in light modulators 38, 39 and 40, respectively. The light modulators 38, 39 and 40 are controlled by control amplifiers 41, 42 and 43 as a function of the drive value signals r, g and b generated in the drive circuit 12. Also, the drive value signals or the rated values for a light regulation by means which produces a linear relationship between the drive values and the light intensities. For the purpose of actual value detection of the light intensities sub-beams 47, 48 and 49 are reflected by partial mirror reflectors 44, 45 and 46 out of the laser beams 35', 36' and 37' to photodiodes 50, 51 and 52 to produce actual signals r', g' and b'. Regulating signals r*, g* and b* are formed in comparators 53, 54 and 55. The comparators 53, 54 and 55 also receive inputs from the digital-to-analog converter 18. Control amplifiers 41, 42 and 43 receive the outputs of the comparators 53, 54 and 55. The light modulators 38, 39 and 40 may, for example, be acousto-optical modulators (AOM).

The modulated laser beams 35', 36' and 37' are combined in a recording beam 59 with a mirror 56 which is partially silvered and two dichroitic color filters 57 and 58. The recording beam 59 is focused on the color film 11 with a lens 60 and exposes point-wise and line-wise the color film 11 due to the rotary motion of the recording drum 14 in the direction of arrow 61 and due to the actual relative motion between the recording beam 59 and the recording drum 14.

The color film 11 can be a negative color film or a positive color film (reversal film). It will be assumed for the further discussion that a negative color film is used. Such negative color film consists of a cyan color layer sensitized for the red spectral range, a magenta color layer sensitized for the green spectral range and a yellow color layer sensitized for the blue spectral range. Thus, by means of selected exposure of the color film, the primary color "cyan" results from the red laser beam 35', the primary color "magenta" results from the green laser beam 36', and the primary color "yellow" results from the blue laser 37'. All the remaining colors can occur on the basis of subtractive mixing of the primary colors due to simultaneous exposure of the color film with all three laser beams.

For the purpose of color density linearization which is required as explained above, color wedges, in other words, stepped color densities are first exposed on the film material for each color layer of the color film. In the sample embodiment, the color wedge generator 20 generates stepped color density values in chronological sequence and these are converted in the linearization stage 17 into the corresponding drive values r, g and b and the linearization stage first functions linearly. For recording the color wedge, the color recorder 10 could alternatively be driven with the color separation values Y*, M*, C* and K* stored in the storage medium 1' and for this purpose the linearization stage 17 can be loaded with the inverse function as well as with the maximum values and the interpolation stage 21 has a linear effect.

After the three color wedges have been exposed on the film, the color densities are measured with the densitometer or using the luminance factor $\beta$ ($\lambda$) with the spectral photometer at a specific wavelength $\lambda$ and are measured according to the relationship of $d = \log. 1/\beta$ ($\lambda$) and the measured density values are allocated function-wise to those drive values with which the density values resulted. The inverse function represents the color gradation curve from which the corrected drive values necessary for the linear interrelationship are determined and are deposited in the linearization stage 17.

At the same time, that the color density linearization occurs, the drive values $r_{max}$, $g_{max}$ and $b_{max}$ relating to the maximal attainable color densities in the color layers or, respectively, the associated rated color densities $D_{Ymax}$, $D_{Mmax}$ and $D_{Cmax}$ are identified and these are retrievably stored for later use in the color wedge generator 20.

Maximum color density of a film layer means that it is that density value which can be achieved in the film layer without the other film layers fogging.

Since the reproduction sequence diagram as well as the manner of functioning of the proofrecorder including the color density linearization required for understanding the inventive method have been explained and now the method for determining the rated color densities will be described with the rated color densities being necessary for the color equivalent reproduction of print colors on film material.

The method consists in detail of a number of method steps comprising steps a through e.

In method step a, some characteristic print colors of the print color space are selected and are printed in the form of color fields under production run conditions, in other words, under real conditions such as prevail during the later edition printing or production run.

Real conditions means that the printing on the paper for the production run with actual printing inks as well as the paper running speed and the machine setting for the production run exists.

For example, the color separation values Y*, M*, C* and K* relating to each selected color print are recovered from the storage medium 1' illustrated in FIG. 1 and are processed for printing the color fields on the single edition paper and are referred to hereafter as print color field 64 or, respectively, 65 and are processed through path A for offset printing or B for rotogravure printing depending upon the printing method utilized.

The printing of the color fields can be omitted when a color scale also referred to as a color atlas or color table exists with the same printing parameters and has already been produced. For this case, the characteristic color fields are selected from the printed colors of the color scale.

Figure 3A:
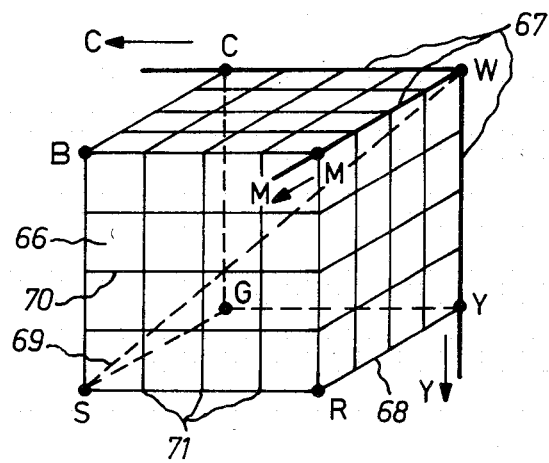
FIGS. 3a and 3b are graphic illustrations of a print color space and chromaticity value coordinate system.

FIG. 3a illustrates a selection of the characteristic print colors in an idealized, cubicle print color space 66 which is formed by the Y, M, C color coordinate axes 67 and in which print color or, respectively, each print color locus is defined by a color coordinate triad (Y, M and C). The corner colors are selected as the characteristic print colors and these are the primary colors yellow (Y*), magenta (M*), and cyan (C*), the secondary colors red (Y*; M*), green (Y*, C*) and blue (M*; C*), white and black (Y*; M*; C*) as well as some of the intermediate colors lying on the cube edges 68 and the gray or neutral axis 69. Also, a supporting or reference point network 70 which extends over the print color space 66 and has three supporting or reference points 71 on each cube edge 68 are also indicated.

The intermediate colors are selected such that they coincide with the reference point 71, respectively, with the center reference point in FIG. 3a. It is to be realized, of course, that the number of reference points in a practical sample embodiment will be significantly greater than those indicated in 3a which are merely to illustrate the principle.

Method step b, characteristic film colors. of the film space which should include all corner colors are exposed using the proof recorder 10 on the film material which is to be used for the proof and the exposure occurs with maximum color density in the form of color fields which will be defined hereafter as film color fields 72 and selected color separation values Y*, M*, C* and K* are obtained from the storage medium 1' and supplied to the proofrecorder 10.

Figure 4A:
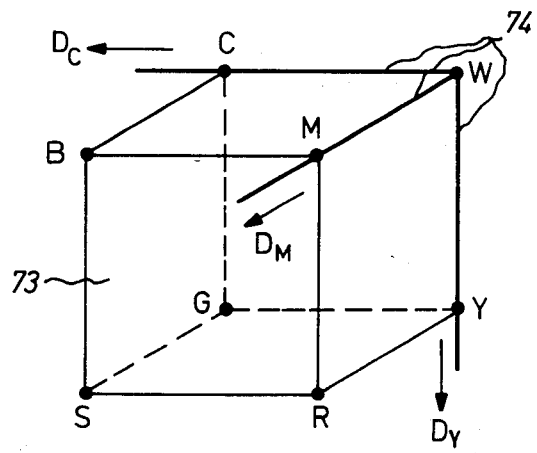
FIG. 4a and 4b are graphic illustrations of film color space and chromaticity value coordinate system.
Figure 4B:
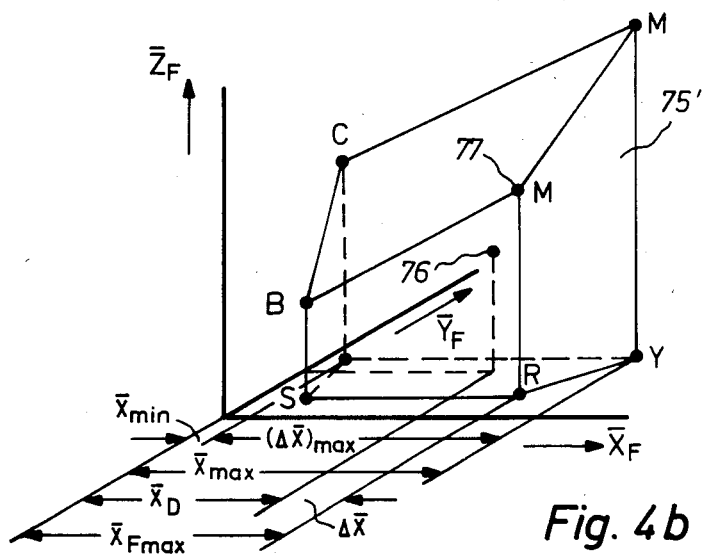

FIGS. 4a and 4b illustrate a film color space 73 which is formed by the color density coordinate axes 74 ($D_Y$, $D_M$ and $D_C$) and in which each film color or respectively each film chromaticity is defined by a color density triad ($D_Y$; $D_M$; $D_C$).

Characteristic film colors are selected as the corner colors of the film color space 73 which are yellow ($D_{Ymax}$), magenta ($D_{Mmax}$) and cyan ($D_{Cmax}$) as well as black ($D_{Ymax}$; $D_{Mmax}$; $D_{Cmax}$), white, red ($D_{Ymax}$; $D_{Mmax}$), green ($D_{Ymax}$; $D_{Cmax}$) and blue ($D_{Mmax}$; $D_{Cmax}$).

In the sample embodiment, the color density values $D_{Ymax}$, $D_{Mmax}$ and $D_{Cmax}$ required for the exposure of the characteristic film colors with maximum color density are produced by the color wedge generator 20 illustrated in FIG. 2 and are converted in the linearization stage 17 into drive values $r_{max}$, $g_{max}$ and $b_{max}$ and are supplied to the color recording unit 13 of the proof recorder 10. The drive values required for the exposure of the individual film colors are listed in the following Table.

| Film Color | Color Densities | Drive Values |
|---|---|---|
| yellow | $D_{Ymax}$ | $b_{max}$ |
| magenta | $D_{Mmax}$ | $g_{max}$ |
| cyan | $D_{Cmax}$ | $r_{max}$ |
| white | | |
| black | $D_{Ymax}$; $D_{Mmax}$; $D_{Cmax}$ | $r_{max}$; $g_{max}$; $b_{max}$ |
| red | $D_{Ymax}$; $D_{Mmax}$ | $g_{max}$; $b_{max}$ |
| green | $D_{Ymax}$; $D_{Cmax}$ | $r_{max}$; $b_{max}$ |
| blue | $D_{Mmax}$; $D_{Cmax}$ | $r_{max}$; $g_{max}$ |

Method step c, color identification values for example the chromaticity values $\overline{X}_D$, $\overline{Y}_D$ and $\overline{Z}_D$ are determined for each print color of the print color space generated with rated color density and the corresponding chromaticity values or CIE coordinates $\overline{X}_{Fmax}$, $\overline{Y}_{Fmax}$ and $\overline{Z}_{Fmax}$ are identified for each film color exposed with maximum color density which are essentially the corner colors of the film colors space.

The identification of the chromaticity values or CIE coordinates according to method step c occurs, for example, over the spectral curves of the individual colors. For this purpose, the spectral curves, in other words, the relationship between the luminance factor $\beta$ of the colors and the wavelength are measured in the range of visible light between $\lambda = 400$ through 700 nm, being measured, for example, according to the spectral method or according to the three-axis method according to DIN 5030.

When using the spectral method, the color stimulus function is first identified according to equation 4.

$$\delta(\lambda) = S(\lambda) \cdot \beta(\lambda) \tag{4}$$

In equation 4, $\beta(\lambda)$ is the luminance factor to be measured and $S(\lambda)$ is the known spectral function of the standard light source which is used to illuminate the print color field 66 and the film color fields. The type of light of the standard light source should correspond to the type of viewing light which is also employed for evaluating edition prints. By means of measuring the light reflected by the print colors and film colors using a spectral photometer, the luminance factor $\beta(\lambda)$ and knowing the spectral functions $S(\lambda)$ the color stimulus function $\delta(\lambda)$ according to equation 4 can be measured at the same time.

The chromaticity values or CIE coordinates $\overline{X}$, $\overline{Y}$ and $\overline{Z}$ can be derived according to DIN 5033 from the equation 5.

$$\overline{X} = K \int \delta(\lambda) \overline{x} \, d\lambda \tag{5}$$
$$\overline{Y} = K \int \delta(\lambda) \overline{y} \, d\lambda$$
$$\overline{Z} = K \int \delta(\lambda) \overline{z} \, d\lambda$$

In equations 5, $\overline{x}$, $\overline{y}$ and $\overline{z}$ are standardized spectral values which reproduce the physiological color sensation of a normal observer.

In case the corner colors red, green and blue of the film color space were not exposed during method step b the spectral curves for these colors can be determined from the spectral curves of the three film layers.

After method step c, the chromaticity values or CIE coordinates $\overline{X}_D$, $\overline{Y}_D$ and $\overline{Z}_D$ of the most characteristic print colors and the chromaticity triads $\overline{X}_{Fmax}$, $\overline{Y}_{Fmax}$ and $\overline{Z}_{Fmax}$ of the characteristic film corner colors are known.

Figure 3B:
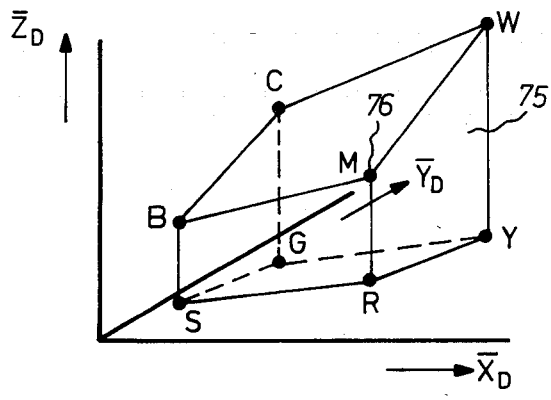

FIG. 3b shows the standardized color coordinate system 75 in which each print color is described by a CIE coordinate triad for example, the print corner color 76 "magenta" is described by the CIE coordinate triad ($\overline{X}_D$; $\overline{Y}_D$; $\overline{Z}_D$).

A corresponding chromaticity coordinate 75' is illustrated in FIG. 4b for the film color space 73. In this chromaticity coordinate system 75' each film color is described by a CIE coordinate triad ($\overline{X}_F$, $\overline{Y}_F$, $\overline{Z}_F$) and each film corner color, for example, "magenta" is described by the CIE coordinate triad ($\overline{X}_{Fmax}$; $\overline{Y}_{Fmax}$; $\overline{Z}_{Fmax}$). By agreement, the X axis in the chromaticity coordinate system proceeds in the direction of an increasing red component, the Y axis proceeds in the direction of an increasing green component and the Z axis proceeds in the direction of an increasing blue component.

A comparison of FIGS. 3b and 4b shows that the color spaces 66 and 73 have different shapes in the two chromaticity coordinate system 75 or 75'. In other words, the characteristic print colors and film colors are reproduced by different CIE coordinates and this is explained with reference to the example of the color "magenta". When the print color locus 76 "magenta" is projected into the chromaticity coordinate system 75', then this does not coincide with the film color locus 77 "magenta" and in other words the print and film color "magenta" are thus not color equivalent since $\overline{X}_D \neq \overline{X}_{Fmax}$, $\overline{Y}_D \neq \overline{Y}_{Fmax}$ and $\overline{Z}_D \neq \overline{Z}_{Fmax}$.

Method step d, consists of altering the maximum color densities $D_{Ymax}$, $D_{Mmax}$ and $D_{Cmax}$, at which the characteristic film colors were exposed in method step a into rated color density values $D_Y$, $D_M$ and $D_C$ or, respectively, rated drive values r, g and b such that the film colors exposed with the rated color densities exhibit the same or almost the same CIE coordinates as the corresponding print colors ($\overline{X}_F \to \overline{X}_D$; $\overline{Y}_F \to \overline{Y}_D$; $\overline{Z}_F \to \overline{Z}_D$), so that the color equivalent reproduction of the print colors on the film material is assured.

The modification of the maximum color density values into the required rated color density values can also occur by means of an iterative approximation since all three CIE coordinates change with a change of only one maximum density value.

Various approximation methods can be applied for identifying the rated color density values, for instance, such as that described by N. Ohta in the periodical "Applied Optics", of September 71, Volume 10, No. 9.

A simplified approximation method is specified in the sample embodiment wherein one cycle sequencing follows for one of the print colors for example for the print color 76 "magenta" with the sequencing defined in steps $d_1$ through $d_4$ described below.

In a first step $d_1$, the vectorial distances "d" between the associated print color locus 76 and all film corner color locii in the chromaticity coordinate system 75' of the film color space 73 are first calculated, for example, according to the distancing equation 6 and the film color locus lying closes to the associated print color locus 76 is identified.

$$d = \sqrt{(X_{Fmax} - X_D)^2 + (Y_{Fmax} - Y_D)^2 + (Z_{Fmax} - Z_D)^2} \quad (6)$$

In a second step $d_2$, the CIE coordinate differences between the print color locus 76 and the film color locus lying closest thereto are formed according to equations 7 and the maximum CIE coordinate or chromaticity difference is noted.

$$\Delta \overline{X} = \overline{X}_{Fmax} - \overline{X}_D \quad (7)$$
$$\Delta \overline{Y} = \overline{Y}_{Fmax} - \overline{Y}_D$$
$$\Delta \overline{Z} = \overline{Z}_{Fmax} - \overline{Z}_D$$

In a third step $d_3$, one of the color density values $D_Y$, $D_M$ or $D_C$ or, respectively, one of the drive voltage values r, g or b is modified by an amount such as $\Delta D_Y$, $\Delta D_M$ or $\Delta D_C$ so that the maximum CIE coordinate or, chromaticity difference becomes zero.

It should be realized, for example, that with increasing drive value r, the color or dyestuff concentration of the cyan film layer or, respectively, the cyan color density $D_C$ is increased, whereas the red component of the color film and, thus, the CIE coordinate or chromaticity value $\overline{X}$ decreases particularly where the CIE coordinate or chromaticity value $\overline{X}$ is minimum ($\overline{X}_{min}$) with $D_{Cmax}$ and is maximum ($\overline{X}_{max}$) with $D_{Cmin}$. In an analogous manner, the CIE coordinate or chromaticity value $\overline{Y}$ decreases, the largest amount with an increasing drive value g and the CIE coordinate or chromaticity value $\overline{Z}$ decreases the largest amount with an increasing drive value b. The amounts of change $\Delta D_C$, $\Delta D_M$ or $\Delta D_Y$ required for the compensation of the CIE coordinate or chromaticity value differences $\Delta \overline{X}$, $\Delta \overline{Y}$ or $\Delta \overline{Z}$ can be obtained according to equations 8.

$$\Delta D_C = \Delta \overline{X} \frac{(\Delta D_C)_{max}}{(\Delta \overline{X})_{max}} \quad (8)$$

$$\Delta D_M = \Delta \overline{Y} \frac{(\Delta D_M)_{max}}{(\Delta \overline{Y})_{max}}$$

$$\Delta D_Y = \Delta \overline{Z} \frac{(\Delta D_Y)_{max}}{(\Delta \overline{Z})_{max}}$$

From equations 8:

$(\Delta \overline{X})_{max} = \overline{X}_{max} - \overline{X}_{min}$ $(\Delta \overline{Y})_{max} = \overline{Y}_{max} - \overline{Y}_{min}$ $(\Delta \overline{Z})_{max} = \overline{Z}_{max} - \overline{Z}_{min}$ $(\Delta D_C)_{max} = D_{Cmax} - D_{Cmin}$ $(\Delta D_M)_{max} = D_{Dmax} - D_{Mmin}$ $(\Delta D_Y)_{max} = D_{Ymax} - D_{Ymin}$ In a method step $d_4$, the CIE coordinates $\overline{X}_F'$, and $\overline{Y}_F'$ and $\overline{Z}_F'$ of the new film color locus approximated to the print color locus are calculated over the spectral curves. In a following cycle, the CIE coordinate or chromaticity value differences between the print color locus and the new film color locus are again identified and the new maximum CIE coordinate or chromaticity value differences identified and the associated drive values are correspondingly changed so that a new further approximated film color locus is obtained. These approximations cycles are then continued until the film color locus has approached the appertaining print color locus such that they are nearly colorimetically identical.

After the approximate calculation according to method step d, each selected print color of the print color space or, respectively, its color separation values Y, M, C and K has a color density triad $D_Y$, $D_M$ and $D_C$ allocated to it.

Figure 5C:
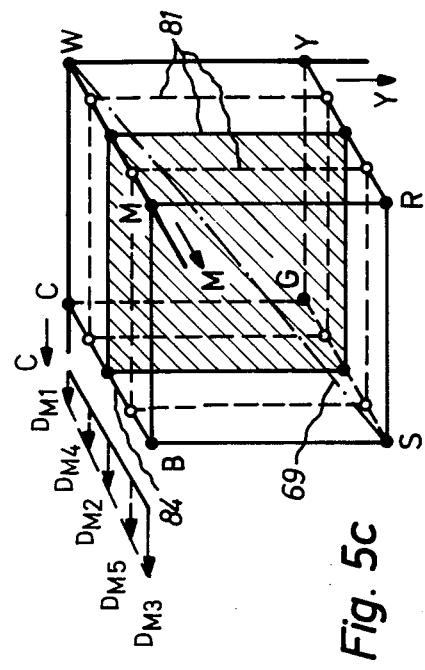
FIGS. 5a through 5f are graphic illustrations illustrating how interpolation can be accomplished and FIG. 6 illustrates the color recorder means.
Figure 5D:
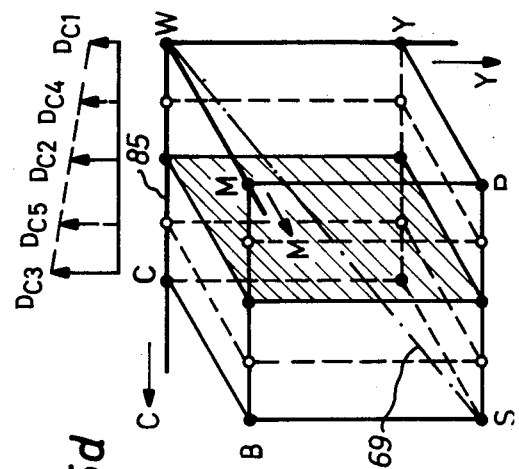
Figure 5A:
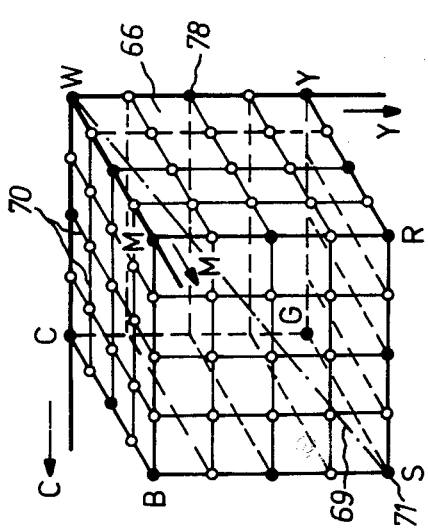

FIG. 5a shows the print color space 66 with the reference supporting point network 70 and the gray or neutral axis 69. The supporting or reference points 71 occupied with the color density values obtained by the preceding method steps are illustrated as solid dots; for example, the color density triad $D_{Y1}$, $D_{M1}$ and $D_{C1}$ is allocated to the corner color "white", and the color density triad $D_{Y2}$, $D_{M2}$ and $D_{C2}$ is allocated to the intermediate color 78, and the color density triad $D_{Y3}$, $D_{M3}$ and $D_{C3}$ is allocated to the corner color "yellow".

Method step e, in this step all supporting or reference points 71 of the entire three-dimensional supporting or reference point networks 70, starting from the supporting or reference points which are already known must have corresponding color density triads allocated to them by using three-dimensional interpolation. These references or supporting points which are to be determined are illustrated in FIG. 5a by opened circles. One can see that the three-dimensional spatial interpolation starts from values which essentially lie on the cube edges of the print color space 66.

Method step e can be accomplished using any desired interpolation method and a particularly advantageous interpolation method is described as follows.

Figure 5B:
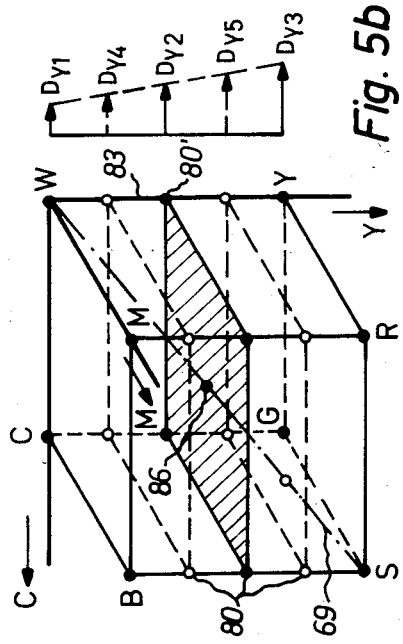

In a first step $e_1$, the print color space 66 is subdivided into a yellow cube illustrated in FIG. 5b, a magenta cube FIG. 5c and a cyan cube indicated in FIG. 5d for the separate color densities $D_Y$, $D_M$ and $D_C$.

For the yellow cube, substantially all the color density values $D_Y$ change for all supporting or reference points which lie on the four cube edges (white-yellow; magenta-red; blue-black; cyan-green) starting parallel to the Y axis hereafter identified as the privileged edges of the yellow cube and the color density values $D_M$ and $D_C$ are substantially constant. Also, the color density values $D_Y$ are constant in a first approximation in all parallel supporting reference point planes 80 (yellow planes) for which the Y-axis is normal to the surface.

On the other hand, for the magenta cube essentially only the color density values $D_M$ change for the supporting or reference points lying on the privileged edges (white-magenta; cyan-blue; yellow-red; green-black) whereas the color density values $D_M$ are constant in a first approximation in all parallel supporting reference point planes 81 (magenta planes) for which the magenta coordinate axis is normal to the surface. Also, with the cyan cube essentially only the color density values $C_Y$ change for all supporting reference points lying on the privileged edges (white-cyan; magenta-blue; yellow-green; red-black) whereas the color densities are essentially constants for all supporting reference points lying on the parallel supporting or reference point planes 82 (cyan planes) for which the C-axis is normal to the surface.

In a second step $e_2$, the supporting or reference points respectively, lying on the four privileged edges for the yellow, magenta and cyan cubes are identified with a first interpolation hereafter described as edge interpolation.

The edge interpolation is illustrated in FIGS. 5b through 5d wherein the separate diagrams for a respective privileged edge 83, 84 and 85 for the respective color density values entered in the diagram as arrows. For the yellow cube, for example, the color densities $D_{Y1}$, $D_{Y2}$ and $D_{Y3}$ are known and the color densities $D_{Y4}$ and $D_{Y5}$ (indicated as broken line arrows) are calculated using interpolation. At the same time, the color density values for all penetration points of the gray or neutral line through the individual planes are identified.

After the edge interpolation and the interpolation on the gray or neutral line, a second interpolation (plane interpolation) is carried out in step $e_2$ in all supporting or reference point planes 80, 81 and 82 including the associated outer cube faces of the yellow, magenta and cyan cubes with these being carried out, for example, at the supporting reference point plane 80' of the yellow cube which has the penetration point 86 of the gray or neutral line 69.

The plane interpolation will be explained relative to FIGS. 5e and 5f relative to two successive substeps $e_{21}$ and $e_{22}$.

Figure 5E:
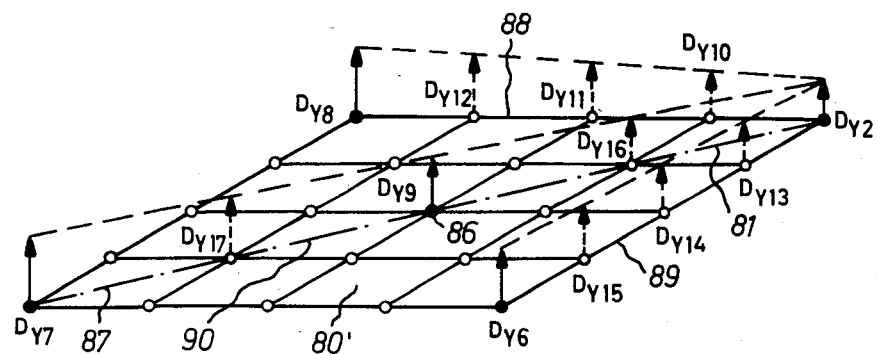

FIG. 5e shows the supporting or reference point plane 80' with corner supporting or reference points which have already had the color density values $D_{Y2}$, $D_{Y6}$, $D_{Y7}$ and $D_{Y8}$ allocated to them as a result of the preceding edge interpolation. Further, a surface diagonal 87 and the penetration point 86 of the gray or neutral line 69 are indicated extending through the supporting or reference point plane 80'. Since the penetration point 86 is a supporting reference point of the gray or neutral line 69, the associated color density value $D_{Y9}$ has already been identified in the gray or neutral line interpolation. The supporting or reference points already occupied with color density values are again symbolized as solid dots and the supporting or reference points to be occupied with color density values are symbolized as open circles and the color density values are symbolized by arrows.

In a first substep $e_{21}$ of the plane interpolation, the color density values $D_{Y10}$, $D_{Y11}$ and $D_{Y12}$ are interpolated between the color density values $D_{Y2}$ and $D_{Y8}$ on the side 88 of the supporting or reference point plane 80' and the color density values $D_{Y13}$, $D_{Y14}$ and $D_{Y15}$ are interpolated between the color density values $D_{Y2}$ and $D_{Y6}$ on side 89 and the color density value $D_{Y16}$ is interpolated between the color density values $D_{Y2}$ and $D_{Y9}$ on sections 90 and 91 of the surface diagonals 87 determined by the penetration point 86 and the color density value $D_{Y17}$ is interpolated between the color density values $D_{Y7}$ and $D_{Y9}$.

Figure 5F:
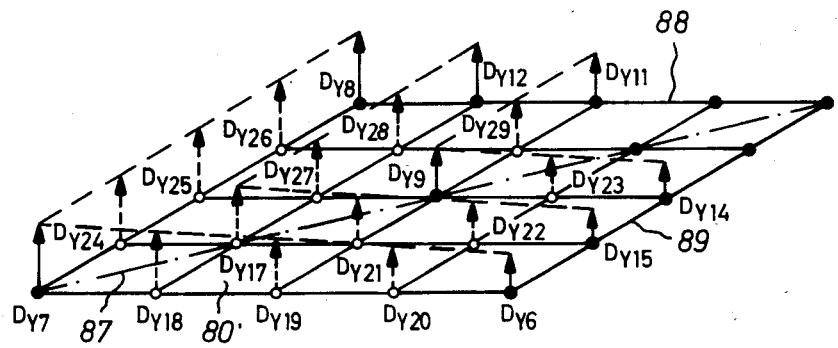
Figure 6:
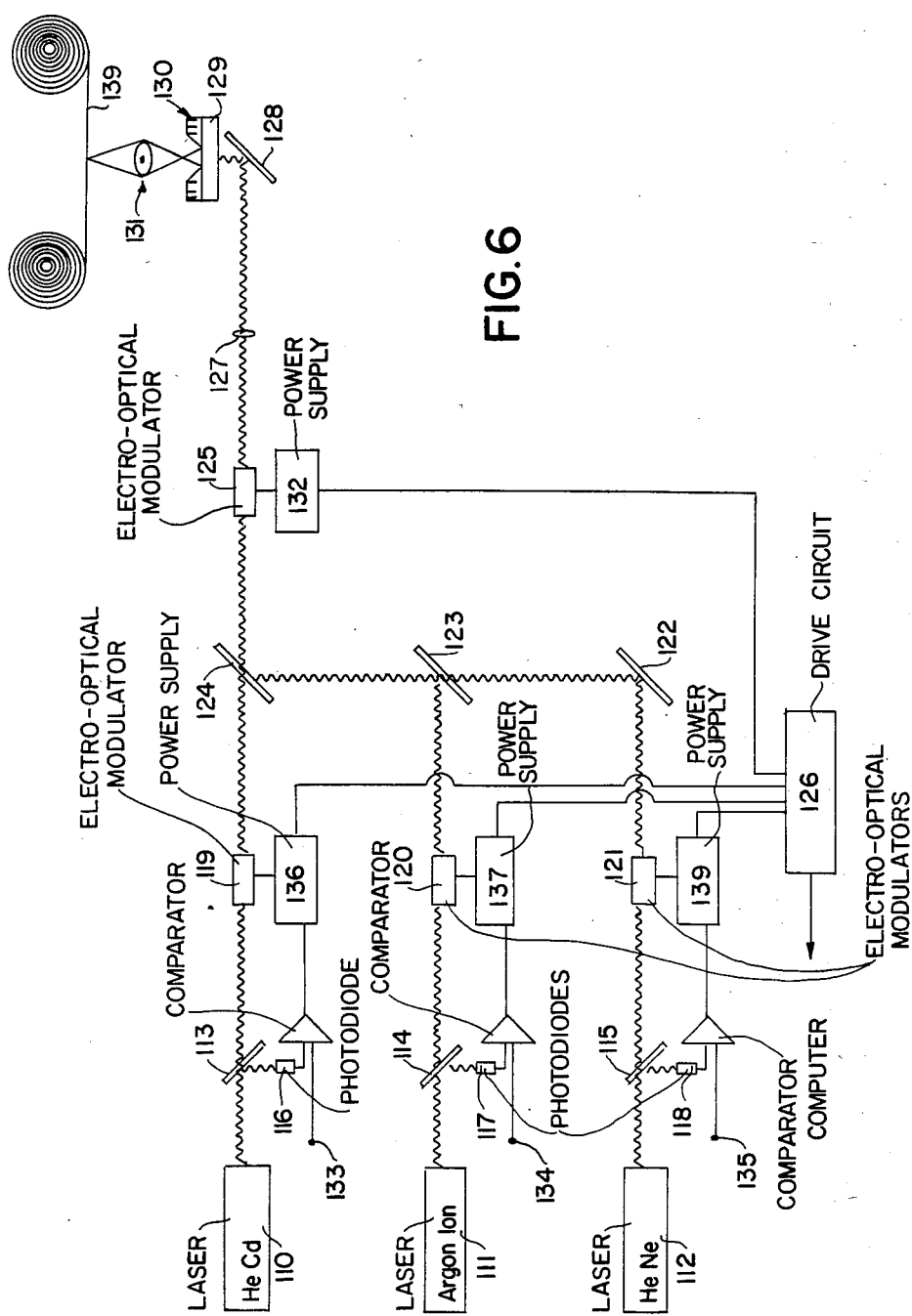

In a second sub-step $e_{22}$ of the plane interpolation as illustrated in FIG. 5f, first, all color density values are interpolated parallel to the side 88 of the supporting or reference point plane 80' between the color density values of the side 89 and the color density values of the surface diagonal 87. In particular, the color density values $D_{Y18}$, $D_{Y19}$ and $D_{Y20}$ between the color density values $D_{Y7}$ and $D_{Y6}$ and the color density values $D_{Y21}$ and $D_{Y22}$ between the color density values $D_{Y17}$ and $D_{Y15}$ and the color density value $D_{Y23}$ between the color density values $D_{Y9}$ and $D_{Y14}$.

Subsequently, the plane interpolation parallel to the side 89 between the color density values of side 88 and the surface normal 86 is accomplished and in detail the color density values $D_{Y24}$, $D_{Y25}$ and $D_{Y26}$ are interpolated between the color density values $D_{Y7}$ and $D_{Y8}$ and the color density values $D_{Y17}$, $D_{Y27}$ and $D_{Y28}$ are interpolated between the color density values $D_{Y18}$ and $D_{Y12}$ and the color density values $D_{Y29}$ is interpolated between the color density values $D_{Y9}$ and $D_{Y11}$.

The color density values can be identified by means of any desired interpolation method for example, by a means of a linear interpolation or by means of an interpolation according to that taught by Newton. It is proven particularly expedient to apply the spline interpolation between particularly smooth curve progressions between the supporting or reference point values.

The spline function does not guarantee that the interpolated curve proceeds monotonously due to monotonous supporting or reference values. It nevertheless assures that the true function is approximated better where the values of the first approximation are small. Given monotonous curves, the maximum slope lies in the range 0 through $+\infty$ (increase) or, respectively, 0 through $-\infty$ (decrease). By means of rotating the coordinate system, the value range of the first derivative can be reduced to the range of $-1$ through $+1$. This occurs by means of matching the antecedent or pre-image axis and image axis to the identical dimension numbers and by means of rotating the antecedent or pre-image axis on the stright line through the initial and final values. The coordinate system must be then rotated back after interpolation.

After all the color density values for the supporting or reference point network 70 of the print color space 66 have been obtained, they are loaded into the supporting or reference point memory of the interpolation stage 21 in the color converter 16 of the proof recorder 10 illustrated in FIG. 2.

A recording of the isochromatic proof can then begin, and for this purpose, the corresponding color separation values of the proofs are read out of the storage medium and supplied to the proof recorder 10.

Although the invention has been described with respect to preferred embodiments, it is not to be so limited as changes and modifications can be made which are within the full intended scope of the invention as defined by the appended claims.

We claim as our invention:

1. A method for producing color pictures which are used for quality control in multicolor printing by means of exposing chromatic photographic material such as paper or film with chromatic light, whereby the colors produced on the chromatic photographic material by exposure coincide with the colors to be printed on a print medium, characterized in that, the following steps are accomplished:
    (a) before recording the color picture identifying the color density values for the photographic chromatic material required for a color-equivalent recording by mensurational or visual comparison of printed and exposed colors;
    (b) using the color separation values of the color which are to be printed and the corresponding color density values during the recording of the color picture;
    (c) determining the allocated color density values instead of the color separation values and converting the color density values into drive values for a color exposure unit.

2. A method according to claim 1, characterized in that, the following steps are accomplished: before recording the color picture
    (a) printing selected colors (64, 65) of the print color space (66) on the print medium (8, 9), by
       (a$_1$) producing printing forms (4, 5) from the color separation values (Y*, M*, C*, K*) of these selected colors over the color separations, and by
       (a$_2$) printing the selected colors (64, 65) on the print photographic medium (8, 9) with the printing forms (4, 5) in the printing machine (6, 7) provided for the multicolor or process printing under production run conditions;
    (b) linearizing the color density values with the device (10) provided for the recording of the color picture with a color exposure unit (13), by
       (b$_1$) prescribing and converting stepped rated color density values (D$_Y$, D$_M$, D$_C$) into drive values (r, g, b) for the color exposure unit (13), whereby the drive values determine the light energies of the chromatic light;
       (b$_2$) exposing color wedges on the chromatic material (11) with the drive values,
       (b$_3$) measuring for identification the exposed color wedges density-wise for identifying the actual color density values; and
       (b$_4$) using the measured actual color density values of the color wedges and the prescribed rated color density values such that the color densities corresponding to the prescribed rated color density values are achieved on the photographic chromatic material (11) by means of outputting the color density values used instead of the rated color density values to the color exposure unit (13);
    (c) identifying simultaneously, the maximum color density values required in order to achieve as high as possible a color saturation on the chromatic material (11) on the basis of the color wedges;
    (d) exposing colors (72) of the film color space (73) on the chromatic material (11) and the linearized, maximum color density values are called in and are converted into the drive values for the color exposure unit (13);
    (e) identifying color identification values ($\overline{X}_D$, $\overline{Y}_D$, $\overline{Z}_D$) of the colors (64, 65) printed on the print medium (8, 9) and color identification values ($\overline{X}_F$, $\overline{Y}_F$, $\overline{Z}_F$) of the colors exposed on the chromatic material (11);
    (f) matching the color identification values of each exposed color to the color identification values of the corresponding printed color and proceeding from the maximum color density values, corresponding color density values are modified into rated color density values which are necessary for the color-equivalent reproduction of the color image;
    (g) obtaining by interpolation the corresponding rated color density values for further colors of the print color space from the identified rated color density values of the exposed colors;
    (h) using the rated color density values required for color-equivalent reproduction on the chromatic material to the color separation values of these colors of the print color space; and during the recording of the color picture,
    (i) calling up the color separation values of the colors of the color picture to be exposed, the appertaining rated color density values are output instead of the called-in color separation values and are converted into the drive values for the color exposure unit (13); and
    (j) exposing with the color exposure unit (13) the chromatic material (11) point-by-point and line-by-line.

3. A method according to claim 1 or 2, allocating color separation values and rated color density values for all theoretically possible colors of the print color space before the exposure of the color picture.

4. A method according to claim 1 or 2, comprising:
    (a) using color separation values and rated color density values before the color picture exposure for only a part of the theoretically possible colors of the print color space supporting reference point network; and
    (b) obtaining by interpolation the rated color density values appertaining to the called-in color separation values of the color picture to be recorded during the color picture exposure and are output.

5. A method according to claims 1 or 2, comprising selecting the corner colors of the print color space as the colors to be printed on the print medium (step a).

6. A method according to claim 5, comprising, selecting additional colors on the gray or neutral axis and intermediate colors on the edges of the print color space.

7. A method according to claim 1 wherein the color identification values are the CIE coordinates.

8. A method according to claim 7, comprising, identifying the CIE coordinates over the spectral luminance values.

9. A method according to claim 1 comprising producing the printing forms in offset printing by means of a scanner.

10. A method according to claim 1 comprising, producing the printing forms in rotogravure by means of an engraving machine.

11. A method according to claim 2 comprising, using the rated color density values (step h) to the color separation values by considering the print gradation curve which depends on the printing process which is to be used.

12. A method according to claim 2, comprising:
(a) using the rated color density values (step h) to the color separation values modified according to a print gradation curve dependent on the printing process which is to be used; and
(b) modifying the called-in color separation values of the color picture according to the gradation curve during the color picture exposure.

13. A method according to claim 2, comprising matching in an iterative approximation step the CIE coordinates of an exposed color to the CIE coordinates of a printed color (step f) with the following steps:
(a) identifying the vectorial distances of the color locus of the printed color (print color locus) from the color locii of the exposed colors (film color locus) in the chromaticity value coordinate system and determining the film color locus lying closest;
(b) forming the CIE coordinate differences between the print color locus and the film color locus lying closes thereto and determining the greatest CIE coordinate difference;
(c) modifying the rated color density values in a manner such that the maximum CIE coordinate difference becomes zero:
(d) calculating the CIE coordinates of a new film color locus obtained by color density modification and approximated to the print color locus; and
(e) executing a further step of approximation step with the new film color locus.

14. A method according to claim 2, comprising determining the rated color density values from the rated color density values of the exposed colors (step h) sequences with the following method steps:
(a) determining the color density values to be allocated for all color locii lying on the edges of the print color space from the color density values which have already been allocated to the color locii of the corresponding edges by a first interpolation;
(b) subdividing the print color space into parallel color locus planes, namely into
(b$_1$) yellow planes for which the yellow axis of the print color space is the surface normal;
(b$_2$) magenta planes for which the magenta axis of the print color space is the surface normal, and into
(b$_3$) cyan planes for which the cyan axis of the print color space is the surface normal;
(c) determining in every plane the allocated color density values for all color locii lying on the edges of the color locus planes from the color density values which have already been allocated to color locii of the appertaining edges, with a second interpolation;
(d) determining in every color locus plane, the color density values to be allocated for all color locii lying on one of the diagonals of the color locus plane from the color density values which have already been allocated to color locii of the diagonals, with a third interpolation; and
(e) determining in each color locus plane, the color density values to be allocated for all color locii lying on a plane parallel to the edges of the color locus plane and respectively between the edges and the diagonals from color density values which have already been allocated to the color locii of the edges and the diagonals.

15. A method according to claim 2, comprising exposing with laser light when exposing the color pictures.

16. A method according to claim 2, comprising calculating the black levels from the color separation values for the color separation "black", and superimposing said black levels on the allocated rated color density values of the other color separation values.

17. A method according to claim 2, comprising interpolating the color density values is done with spline functions.

18. An apparatus for exposing color pictures on chromatic material with light having a specific spectral distribution for quality control in multi-color printing processes comprising:
(a) a drive circuit (12) for generating drive values (r, g, b) from color separation values (Y, M, C, K), said drive circuit consisting of:
(a$_1$) a color converter (16) which receives the color separation values and generates color density values ($D_Y$, $D_M$, $D_C$) from the color separation values, and the color density values are a measure of the color densities for the chromatic material required for color-equivalent color picture exposure;
(a$_2$) a linearization stage (17) which receives the output of the color converter (16) and provides color density linearization of the chromatic material; and
(a$_3$) a digital-to-analog converter (18) which receives the output of the linearization stage (17) and converts the color density values modified by the color density linearization into drive value signals; and
(b) a color exposure unit (13) which is connected to the drive circuit (12) and which consists of:
(b$_1$) at least one light source (32; 33; 34) for generating light having three spectral components;
(b$_2$) light modulators (38, 39, 40) which are disposed in the light path and receives the drive value signals in order to alter the intensities of the three spectral components as a function of the drive value signals;
(b$_3$) optical means (56; 57; 58; 60) for focusing the light on the chromatic material (11); and
(c) a recording support (14) carrying the chromatic material (11) and movable relative to the color exposure unit (13).

19. Apparatus according to claim 18, wherein a gradation stage (15) supplies an input to said color converter (16) in order to modify the color separation values according to a gradation curve dependent on the printing process which is to be subsequently used.

20. Apparatus according to claim 18 or 19, comprising said color converter (16) includes the following components:
(a) an allocation means (21) for color density values ($D_Y$, $D_M$, $D_C$) and color separation values (Y, M, C);
(b) a black level computer (23) for calculating black levels from the color separation values (K) for the color separation "black"; and (c) a superimposition stage (24) which is connected to the outputs of said interpolation means (21) and said black level computer (23) in order to superimpose the calculated black levels on the color density values (Y, M, C).

21. Apparatus according to claim 20, comprising said allocation means (21) consists of an allocation memory for color density values ($D_Y$, $D_M$, $D_C$) and color separation values (Y, M, C) and of an interpolation stage.

22. Apparatus according to claim 18 wherein said drive circuit (12) includes a color wedge generator (20) which is connected to the linearization stage (17) in order to call in color density values for the exposure of color wedges on the chromatic material.

23. Apparatus according to claim 18 wherein said light source is at least one laser.

* * * * *